United States Patent [19]
Munakata

[11] Patent Number: 6,163,284
[45] Date of Patent: Dec. 19, 2000

[54] SIGNAL PROCESSING CIRCUIT AND SIGNAL PROCESSING METHOD

[75] Inventor: Ichiro Munakata, Kanagawa, Japan

[73] Assignee: Sony Corporation, Tokyo, Japan

[21] Appl. No.: 09/280,764

[22] Filed: Mar. 29, 1999

[30] Foreign Application Priority Data

Mar. 31, 1998 [JP] Japan .................................. 10-086604

[51] Int. Cl.[7] .................................................. H03M 5/12
[52] U.S. Cl. ............................................. 341/68; 375/211
[58] Field of Search ................ 341/68–71; 375/211–215

[56] References Cited

U.S. PATENT DOCUMENTS

| | | | |
|---|---|---|---|
| 5,216,714 | 6/1993 | Speiser | 380/9 |
| 5,561,714 | 10/1996 | Hershberger | 380/10 |
| 5,721,755 | 2/1998 | Kim et al. | 375/259 |
| 5,937,067 | 8/1999 | Thatcher et al. | 380/21 |
| 5,946,355 | 8/1999 | Baker | 375/286 |
| 6,058,479 | 5/2000 | Sørhaug | 380/201 |

*Primary Examiner*—Howard L. Williams
*Attorney, Agent, or Firm*—Frommer Lawrence & Haug, LLP; William S. Frommer

[57] ABSTRACT

This invention relates to a repeater of a serial digital transmission system. The repeater comprises NRZI/NRZ converter, descrambler, scrambler and NRZ/NRZI converter. Data sent on a coaxial cable is input to a cable equalizer for attenuation characteristic compensation. The NRZI/NRZ converter receives the reception data through D-type flip-flop. Further, the NRZI/NRZ converter converts the reception data from NRZI code to NRZ code. The descrambler descrambles the data obtained by subjecting the reception data to a scrambling process represented by a generating polynomial. The scrambler scrambles the descrambled data output from the descrambler according to a scrambling process represented by the generating polynomial. The NRZ/NRZI converter converts the scrambled data output from the scrambler from NRZ code to NRZI code. A cable driver outputs the data onto the coaxial cable.

6 Claims, 8 Drawing Sheets

FIG. 1A (PDt) (RELATED ART)
FIG. 1B (TSD) (RELATED ART)
FIG. 1C (TSD) (RELATED ART)
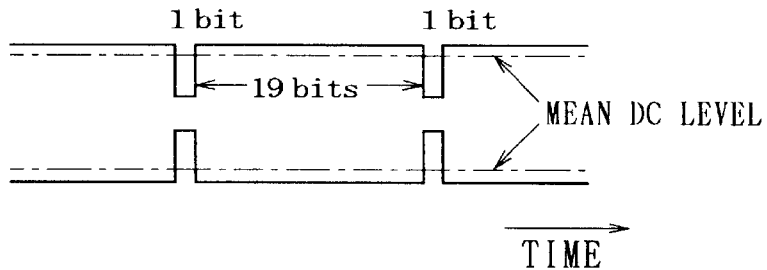
FIG. 2 (RELATED ART)
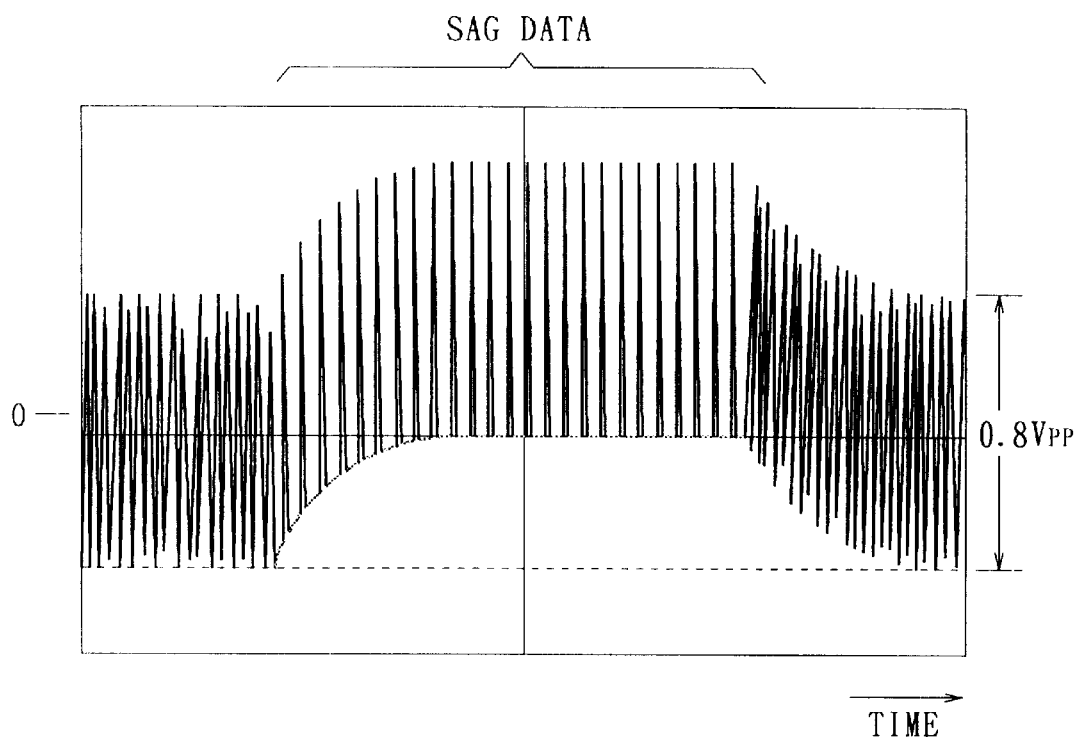
FIG. 3A (PDt) (RELATED ART)
FIG. 3B (TSD) (RELATED ART)
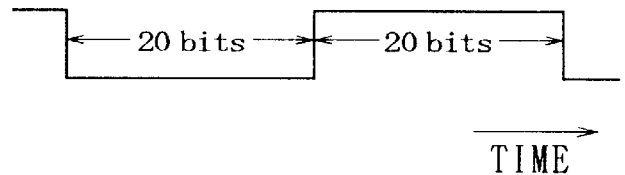

SIGNAL PROCESSING CIRCUIT AND SIGNAL PROCESSING METHOD

BACKGROUND OF THE INVENTION

1. Field of Invention

The present invention relates generally to a signal processing circuit and a signal processing method applied advantageously to a repeater of a serial digital transmission system. More particularly, the invention relates to a signal processing circuit and a signal processing method, in which input serial digital data obtained by subjecting given digital data to a scrambling process represented by a generating polynomial is descrambled and then scrambled again through a scrambling process based on the same generating polynomial in order to provide output serial digital data, thus implementing an inexpensive and highly-reliable serial transmission system on a small circuit scale, which prevents multi-stage propagation of a pathological signal and minimizes a cumulative increase of jitters during multi-stage repeating sessions.

2. Description of Related Art

Under the SDI (Serial Digital Interface) transmission scheme (standardized by SMPTE-295M) currently in effect for broadcasting equipment, serial digital data is subjected to a scrambling process represented by a generating polynomial of $(X^9+X^4+1)$ so as to limit continuations of "0's" or "1's" in the serialized digital data. In order to utilize a coaxial cable that is an unbalanced transmission line, output data is prepared by a neutralizing process effecting conversion from NRZ code to NRZI code. The output data thus acquired is sent on the coaxial cable transmission line.

Under the SDI transmission scheme, as illustratively shown in FIG. 1A, the parallel digital data PDt has a pattern in which 10-bit data of "300" and "198" in hexadecimal occur in turn. In that case, after the scrambling process and/or the NRZ/NRZI conversion are executed, the transmission data TSD may take on a pattern wherein DC components are maximized as shown in FIG. 1B or 1C (called sag data).

When the transmission data TSD is output by the cable driver onto the coaxial cable, the DC components are eliminated. As a result, the waveform of the sag data (in FIG. 1C) sent on the coaxial cable 250 has the positive side level raised and the negative side level lowered as shown in FIG. 2. The data with such a waveform can likely trigger an equalization error in the cable equalizer in any of the repeaters.

Further, the parallel digital data PDt may have a pattern in which 10-bit data patterns of "110" and "200" in hexadecimal occur in turn as illustratively shown in FIG. 3A. In that case, after the scrambling process and/or the NRZ/NRZI conversion are executed, the transmission data TSD may take on a pattern wherein continuations of "0's" and "1's" for 20 clock cycles occur in turn as illustratively shown in FIG. 3B (called bit slip data). When the transmission data TSD has such a bit slip data pattern, the PLL circuit in any of the repeaters receives less phase information for clock regeneration than before, whereby a clock regeneration error is likely to be triggered.

As with the SDI transmission system, there is a case where the repeaters are furnished at intervals on the coaxial cable for multi-stage repeating between the transmitting and the receiving sides. In such a case, the volume of jitters (i.e., amount of temporal fluctuations) in the data being transmitted increases generally in proportion to the repeating stage count raised to the power ½. If the transmission data TSD turns into sag data or bit slip data (called a pathological signal hereunder), multi-stage propagation of such a pathological signal can cause the repeaters to accumulate jitters due to the above-described equalization errors and clock regeneration errors. With the transmission data TSD having a pathological signal, the data arriving at the receiving side contains a large volume of jitters. This causes errors in the reception data with growing frequency.

One conventional way of preventing the cumulative increase of jitters generated in the repeaters above is a use of a repeater 270 whose structure is shown in FIG. 4.

The repeater 270 has a decoding part 280 and an encoding part 290 connected in series. Data Din sent on the coaxial cable is input to a cable equalizer 281 in the decoding part 280 for attenuation characteristic compensation. The cable equalizer 281 transmits the data to both a D-type flip-flop 283 and a PLL circuit 282. The PLL circuit 282 generates a serial clock signal SCKr in synchronism with the output data from the cable equalizer 281. The PLL circuit 282 transmits the serial clock signal SCKr to the D-type flip-flop 283. The D-type flip-flop 283 acquires reception data RSD by latching the output data from the cable equalizer 281 using the clock signal SCKr.

An NRZI/NRZ converter 284 receives the reception data RSD and converts it from NRZI code to NRZ code. A descrambler 285 receives and descrambles the converted data and yields serial digital data SDr. The descrambler 285 transmits the serial digital data SDr to an S/P converter 286 (Serial-to-parallel converter). The S/P converter 286 converts the serial digital data SDr into 10-bit parallel digital data PDr in the SDI format. The parallel digital data PDr constitute the output data of the decoding part 280.

The parallel digital data PDr output from the decoding part 280 is fed to a P/S converter 291 (parallel-to-serial converter) in the encoding part 290 for the conversion into serial digital data SDt. A scrambler 292 receives and scrambles the serial digital data SDt. An NRZ/NRZI converter 293 receives the scrambled data and converts it from NRZ code to NRZI code to provide transmission data TSD. A cable driver 294 receives and outputs transmission data TSD as retransmission data Dout onto the coaxial cable.

In the repeater 270 of FIG. 4, the decoding part 280 initially decodes the input data into the parallel digital data PDr. The parallel digital data PDr is input to the encoding part 290 that carries out P/S conversion, scrambling and NRZ/NRZI conversion on the data based on the parallel clock signal PCK from a crystal oscillator 296. This provides the retransmission data Dout free of jitters that existed in the preceding stages.

However, the repeater 270 has the decoding part 280 and the encoding part 290, each of which is constituted by a considerably large circuit. Therefore, when such the repeater 270 is used in each of the repeating stages this considerably causes an increase of the circuit scale of the SDI transmission system and makes the system expensive.

SUMMARY OF THE INVENTION

It is therefore an object of the present invention to provide a signal processing circuit and a signal processing method for preventing multi-stage propagation of a pathological signal to minimize the cumulative increase of jitters in a multi-stage repeating sessions, thereby implementing an inexpensive and highly reliable serial transmission system on a limited circuit scale.

In carrying out the invention and according to one aspect thereof, I provide a signal processing circuit comprising first and second signal processing devices. The first signal processing device descrambles input serial digital data obtained by subjecting given serial digital data to a scrambling process represented by a generating polynomial. The second signal processing device acquires output serial digital data by subjecting the serial digital data received from the first signal processing device to a scrambling process represented by the generating polynomial.

According to another aspect of the invention, I also provide a signal processing method comprising the steps of descrambling input serial digital data obtained by subjecting given serial digital data to a scrambling process represented by a generating polynomial, and acquiring output serial digital data by subjecting the serial digital data obtained by the above descrambling step to a scrambling process represented by the generating polynomial.

According to the invention, the input serial digital data is obtained by subjecting given serial digital data, such as serial digital data in the SDI format, to a scrambling process represented by a generating polynomial. Preferably, after given digital data is subjected to the scrambling process represented by the generating polynomial, the scrambled digital data may be converted from NRZ code to NRZI code, whereby the input serial digital data may be obtained. When given digital data takes on a specific pattern and when the D-type flip-flops in the scrambler and NRZ/NRZI converter are in a particular state, the input serial digital data becomes a pathological signal.

The input serial digital data is descrambled. The serial digital data derived from the descrambling process is again scrambled to provide the output serial digital data. In this case, when the input serial digital data constitutes a pathological signal, the serial digital data derived from the descrambling process takes on a specific pattern that will likely generate the pathological signal. At this point, however, there is a very low possibility that the D-type flip-flops in the scrambler executing the second scrambling process are in a particular state prone to generating the pathological signal. That is, even when the input serial digital data constitutes a pathological signal, there is only a remote possibility of the output serial digital data becoming a pathological signal as well.

Thus the use of the inventive signal processing circuit and method illustratively in repeaters at each of the repeating stages of a SDI transmission system prevents propagation of a pathological signal in the system and minimizes the cumulative increase of jitters in a multi-stage repeating sessions.

These and other objects, features and advantages of the invention will become more apparent upon a reading of the following description and appended drawings.

BRIEF DESCRIPTION OF THE DRAWINGS

FIGS. 1A, 1B and 1C are schematic views for explaining how sag data occurs;

FIG. 2 is a waveform chart applicable to the sag data occurring on a coaxial cable;

FIGS. 3A and 3B are schematic views for explaining how bit slip data occurs;

DETAILED DESCRIPTION OF THE PREFERRED EMBODIMENTS

Figure 5:
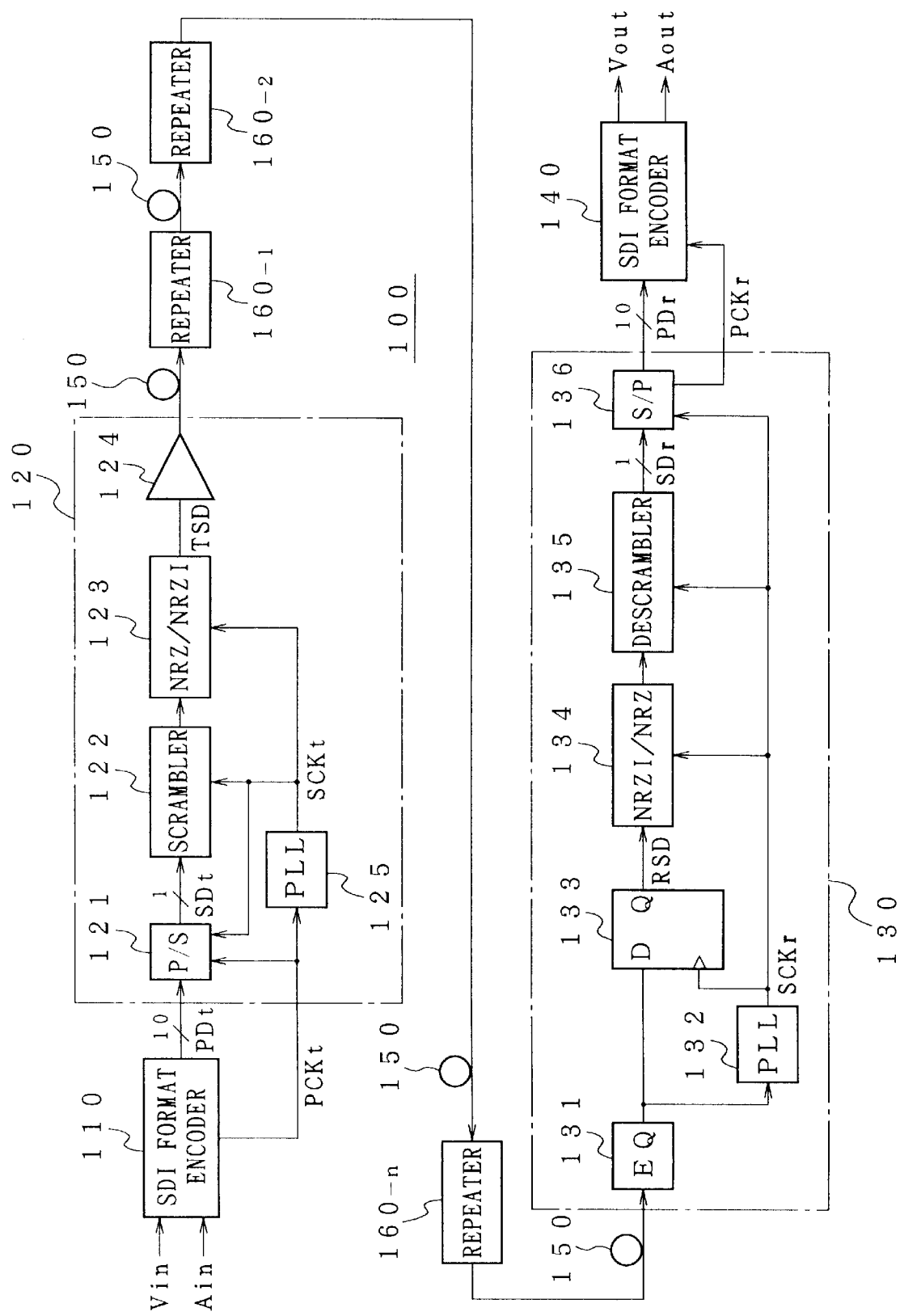
FIG. 5 is a block diagram outlining a constitution of an SDI transmission system using a repeater embodying the invention.

Preferred embodiments of this invention will now be described with reference to the accompanying drawings. FIG. 5 shows a typical constitution of an SDI transmission system 100 wherein a signal processing circuit and a signal processing method of the invention are used. The SDI transmission system 100 comprises an SDI format encoder 110, a transmission data encoder 120, a transmission data decoder 130, an SDI format decoder 140, a coaxial cable 150 for connecting the transmission data encoder 120 to the transmission data decoder 130, and repeaters $160_{-1}$ through $160_{-n}$ on the coaxial cable 150. The SDI format encoder 110 and the transmission data encoder 120 are provided on the transmitting side. The transmission data decoder 130 and the SDI format decoder 140 are provided on the receiving side. The repeater $160_{-1}$ through $160_{-n}$ are interposed at suitable intervals between the transmitting and the receiving sides on the coaxial cable 150.

The SDI format encoder 110 processes input video data Vin and input audio data Ain to produce and output 10-bit parallel digital data PDt in the SDI format.

The transmission data encoder 120 comprises a P/S converter 121, a scrambler 122, and an NRZ/NRZI converter 123 as shown in FIG. 5. The P/S converter 121 converts the parallel digital data PDt transmitted from the SDI format encoder 110 into serial digital data SDt. The scrambler 122 scrambles the serial digital data SDt through a scrambling process represented by a generating polynomial of $(X^9+X^4+1)$. The NRZ/NRZI converter 123 subjects the serial digital data scrambled by the scrambler 122 to a neutralizing process effecting conversion from NRZ code to NRZI code to obtain transmission data TSD (serial digital data). The neutralizing process is carried out preparatory to using the coaxial cable 150 as an unbalanced transmission line.

The transmission data encoder 120 further comprises a cable driver 124 and a PLL circuit 125. The cable driver 124 receives transmission data TSD from the NRZ/NRZI converter 123 and transmits it onto the coaxial cable 150. The PLL circuit 125 references a parallel clock signal PCKt output along with the parallel digital data PDt from the SDI format encoder 110 so as to obtain a serial clock signal SCKt having a frequency 10 times as high as that of the clock signal PCKt. The P/S converter 121 operates on the parallel clock signal PCKt and serial clock signal SCKt, while the scrambler 122 and NRZ/NRZI converter 123 operate on the serial clock signal SCKt.

Figure 6:
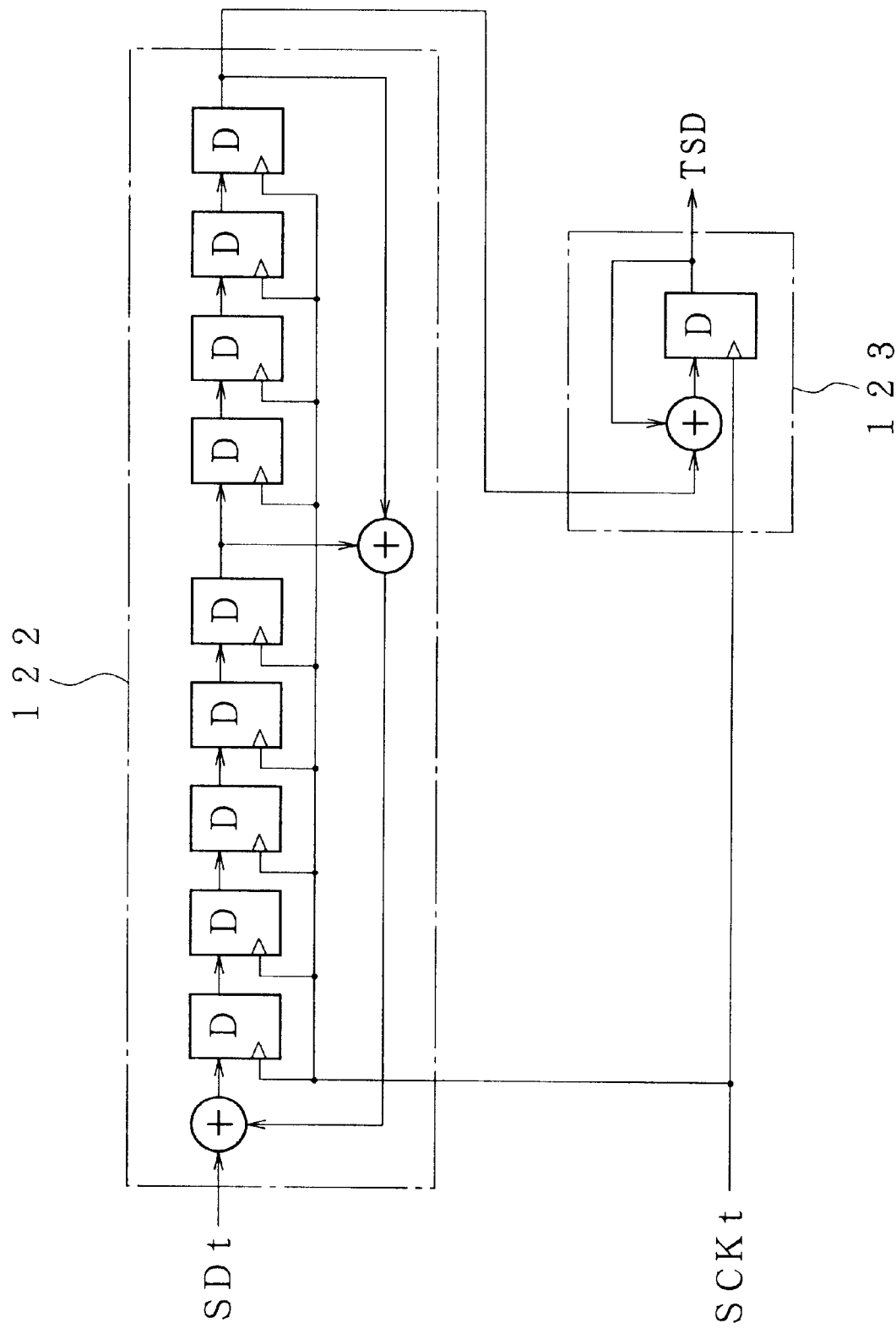
FIG. 6 is a block diagram showing structures of a scrambler and an NRZ/NRZI converter.

FIG. 6 schematically shows typical structures of the scrambler 122 and the NRZ/NRZI converter 123. The scrambler 122 is made up of nine D-type flip-flops each operating on the serial clock signal SCKt and of two exclusive-OR gates. The NRZ/NRZI converter 123 is composed of a D-type flip-flop operating on the serial clock signal SCKt and of an exclusive-OR gate. Thus structured, the scrambler 122 and NRZ/NRZI converter 123 acquire the transmission data TSD by subjecting the serial digital data SDt to a modulo 2 division through the use of a generating polynomial of $G(x)=(x+1)(X^9+X^4+1)$.

The transmission data decoder 130 comprises a cable equalizer 131, a PLL circuit 132, and a D-type flip-flop 133 as shown in FIG. 5. The cable equalizer 131 compensates data sent on the coaxial cable 150 for a frequency-dependent attenuation characteristic that varies with the length of the coaxial cable 150. The PLL circuit 132 regenerates the serial clock signal SCKr in synchronism with the output data from the cable equalizer 131. The D-type flip-flop 133 obtains reception data RSD by latching the output data from the cable equalizer 131 using the serial clock signal SCKr. In this case, the cable equalizer 131 and D-type flip-flop 133 carry out data reproduction.

The transmission data decoder 130 further comprises an NRZI/NRZ converter 134, a descrambler 135 and an S/P converter 136. As opposed to the way the NRZ/NRZI converter 123 of the transmission data encoder 120 operates, the NRZI/NRZ converter 134 converts the reception data RSD from NRZI code to NRZ code. Contrary to the way the scrambler 122 of the transmission data encoder 120 functions, the descrambler 135 obtains serial digital data SDr by subjecting the output data from the NRZI/NRZ converter 134 to a descrambling process. The S/P converter 136 converts the serial digital data SDr into 10-bit parallel digital data PDr in the SDI format.

The NRZI/NRZ converter 134 and descrambler 135 operate on the serial clock signal SCKr acquired by the PLL circuit 132. The S/P converter 136 functions on the serial clock signal SCKr as well as on the parallel clock signal PCKr obtained inside itself. Illustratively, the S/P converter 136 detects SAV and EAV codes internally by subjecting the serial digital data SDr to a pattern matching process. The phase of the parallel clock signal PCKr is determined in properly timed relation with the detection.

Figure 7:
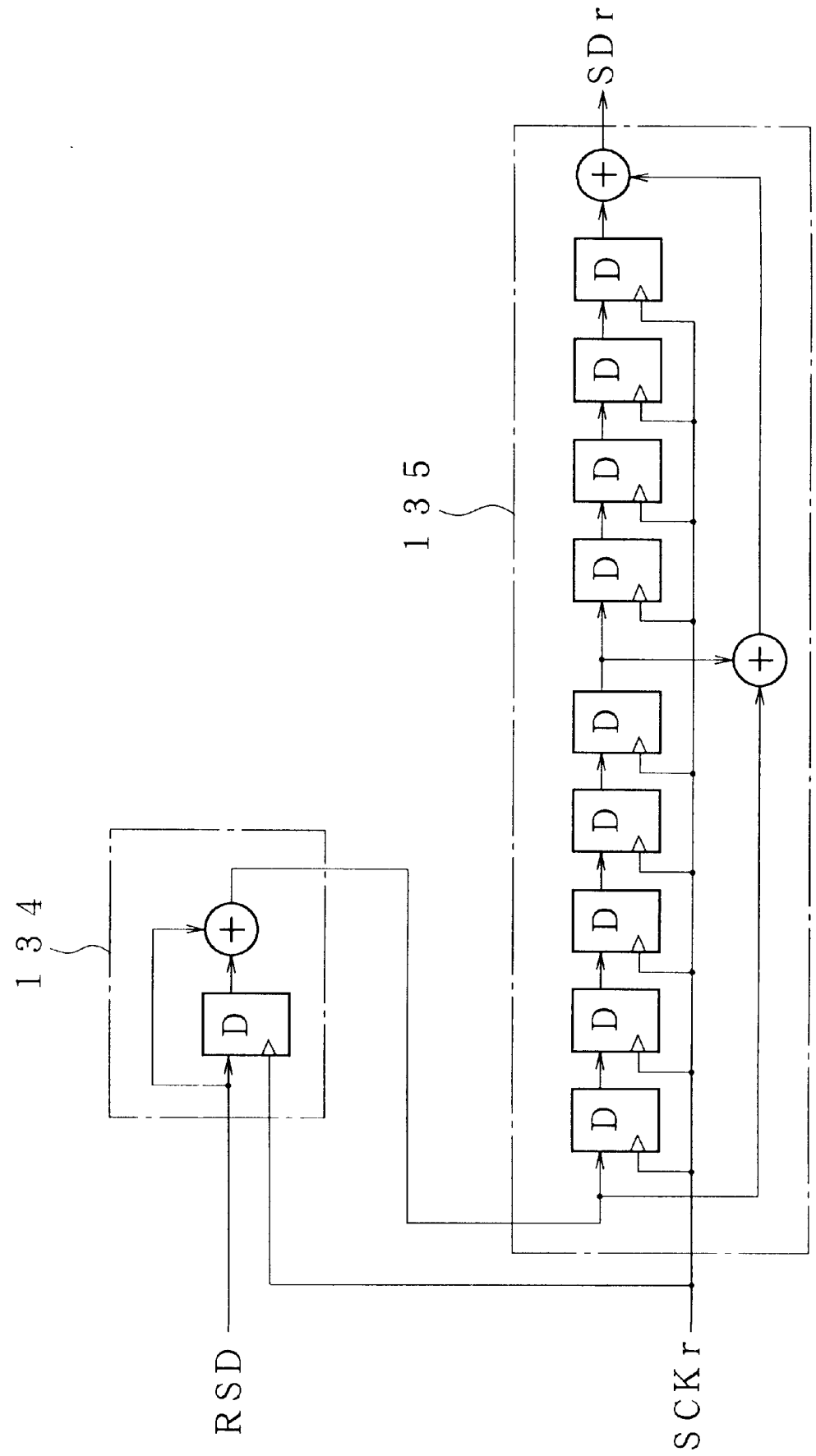
FIG. 7 is a block diagram depicting structures of an NRZI/NRZ converter and a descrambler.

FIG. 7 schematically depicts typical structures of the NRZI/NRZ converter 134 and the descrambler 135. The NRZI/NRZ converter 134 includes a D-type flip-flop that operates on the serial clock signal SCKr and an exclusive-OR gate. The descrambler 135 comprises nine D-type flip-flops each operating on the serial clock signal SCKr and two exclusive-OR gates. In this arrangement, the NRZI/NRZ converter 134 and descrambler 135 obtain the serial digital data SDr by subjecting the reception data RSD to a modulo 2 multiplication based on the generating polynomial of $G(x)=(x+1)(X^9+X^4+1)$.

As opposed to the way the above SDI format encoder 110 functions, the SDI format decoder 140 processes the 10-bit parallel digital data PDr in SDI format from the transmission data decoder 130, thereby outputting video data Vout and audio data Aout, as shown in FIG. 5. The SDI format decoder 140 is supplied with the parallel clock signal PCKr from the transmission data decoder 130.

Each of the repeaters $160_{-1}$ through $160_{-n}$ shown in FIG. 5 regenerates data using a clock signal extracted from the received data and then transmits the regenerated data to the coaxial cable 150.

Figure 8:
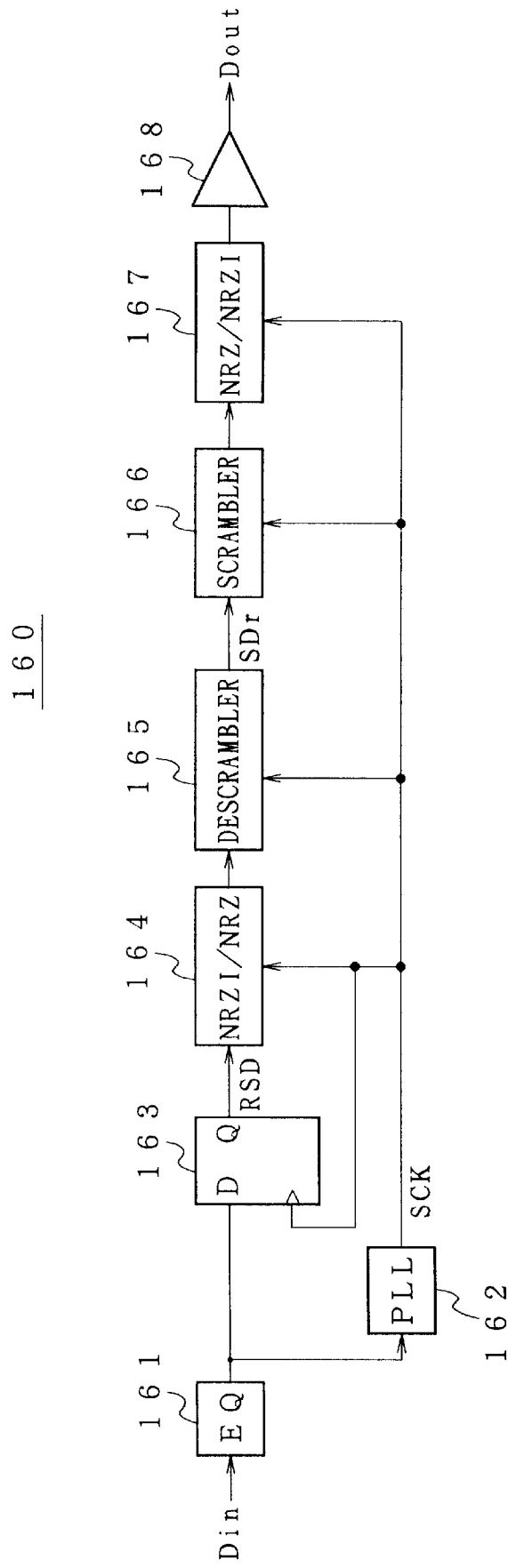
FIG. 8 is a block diagram showing a structure of a repeater embodying the invention.

FIG. 8 schematically depicts a typical structure of a repeater 160 (any one of repeaters $160_{-1}$ through $160_{-n}$) embodying the invention. The repeater 160 comprises a cable equalizer 161, a PLL circuit 162, and a D-type flip-flop 163. The cable equalizer 161 compensates data Din sent from the coaxial cable 150 (not shown in FIG. 8) for a frequency-dependent attenuation characteristic that varies with the length of the coaxial cable 150. The PLL circuit 162 regenerates the serial clock signal SCK in synchronism with the output data from the cable equalizer 161. The D-type flip-flop 163 obtains reception data RSD by latching the output data from the cable equalizer 161 using the serial clock signal SCK. In this case, the cable equalizer 161 and D-type flip-flop 163 carry out data reproduction.

The repeater 160 further comprises an NRZI/NRZ converter 164 and a descrambler 165. As opposed to the way the NRZ/NRZI converter 123 of the transmission data encoder 120 functions, the NRZI/NRZ converter 164 converts the reception data RSD from NRZI code to NRZ code. Contrary to the way the scrambler 122 of the transmission data encoder 120 works, the descrambler 165 obtains serial digital data SDr by descrambling the output data from the NRZI/NRZ converter 164. The NRZI/NRZ converter 165 and descrambler 165 operate on the serial clock signal SCK.

The repeater 160 also includes a scrambler 166, an NRZ/NRZI converter 167, and a cable driver 168. The scrambler 166 scrambles the serial digital data SDr in the same manner as the scrambler 122 of the transmission data encoder 120. The NRZ/NRZI converter 167 converts the output data from the scrambler 166 from NRZ code to NRZI code in the same way in which the NRZ/NRZI converter 123 of the transmission data encoder 120 functions, to obtain retransmission data Dout. The retransmission data Dout is output onto the coaxial cable 150 through the cable driver 168. The scrambler 166 and NRZ/NRZI converter 167 operate on the serial clock signal SCK.

How the repeater 160 shown in FIG. 8 works will now be described. The cable equalizer 161 receives the data Din from the coaxial cable 150 for attenuation characteristic compensation. The cable equalizer 161 transmits the compensated data to the PLL circuit 162 and the D-type flip-flop 163. The PLL circuit 162 acquires the serial clock signal SCK synchronized with the output data from the cable equalizer 161. The D-type flip-flop 163 receives the serial clock signal SCK thus obtained. Further, the D-type flip-flop 163 latches the output data from the cable equalizer 161 using the clock signal SCK to provide the reception data RSD.

The NRZI/NRZ converter 164 receives the reception data RSD and converts it from NRZI code to NRZ code. The descrambler 165 receives and descrambles the data from the NRZI/NRZ converter 164 to provide the serial digital data SDr. The scrambler 166 receives and scrambles the serial digital data SDr and then the NRZ/NRZI converter 167 converts it from NRZ code to NRZI code, whereby the retransmission data Dout is obtained. The cable driver 168 outputs the retransmission data Dout onto the coaxial cable 150.

An SDI format is outlined below.

The SDI format is a format standardized under SMPTE-259M of the Society of Motion Picture and Television Engineers (SMPTE) which issues standards and criteria for digital audio and video signals. SMPTE-259M primarily constitutes a standard for signals in D-1 and D-2 formats stipulated as criteria for digital signals.

Figure 9A:
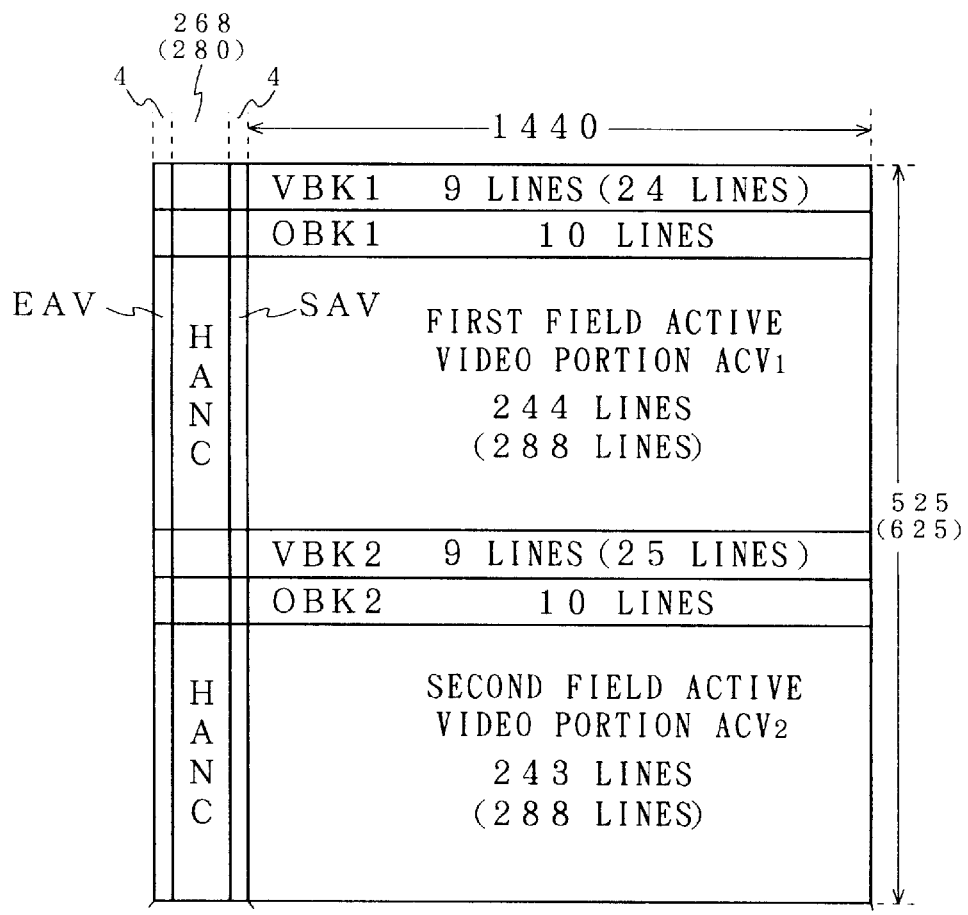
FIGS. 9A and 9B are schematic views for explaining an SDI format.
Figure 9B:
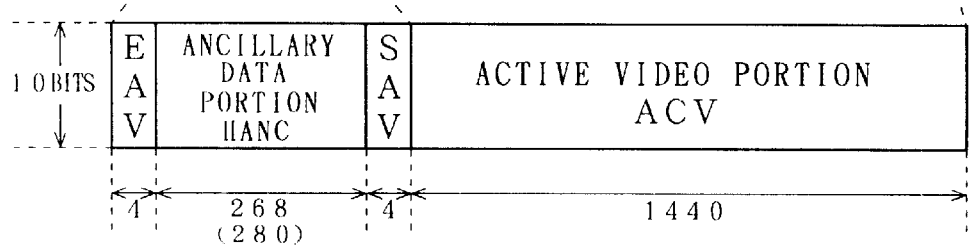

FIG. 9A schematically shows an overall structure of a video signal frame in the SDI format. FIG. 9B illustrates a structure of a transmission packet in the SDI format.

Under the NTSC 525 scheme, a digital video signal in the SDI format is made up of 1,716 words (=4+268+4+1,440) per line horizontally and 525 lines vertically. Under the PAL 625 scheme, a digital video signal in the SDI format is composed of 1,728 words (=4+280+4+1,440) per line horizontally and 625 lines vertically. One word is constituted by 10 bits. In FIGS. 9A and 9B, numbers in parentheses represent those applicable to the video signal of the PAL 625 scheme; numbers not in parentheses are those of the video signal under the NTSC 525 scheme. For purpose of simplification, the following description will concern only the NTSC scheme.

On each line, the first through the fourth word indicate an end of an active video portion (ACV). The four-word region is used as a region for accommodating an active video portion end code EAV (End of Active Video) that separates the active video portion ACV from an ancillary data portion HANC, to be described later. The four-word code EAV comprises 3FF, 000, 000, and XYZ (any data) in hexadecimal notation.

On each line, the fifth through the 272nd word spanning 268 words are used as an ancillary data portion HANC. This portion stores a header, ancillary data, audio data and others.

On each line, the 273rd word through the 276th word spanning four words indicate the start of an active video portion ACV. This portion is used as a region for accommodating an active video portion start code SAV (Start of Active Video) that separates the active video portion ACV from an ancillary data portion HANC. The four-word code SAV comprises 3FF, 000, 000, and XYZ (any data) in hexadecimal notation. The first three words make up the same data as those of the code EAV above.

On each line, the 277th word through the 1,716th word spanning 1,440 words are used as an active video portion ACV that stores video data. The 525-line area is divided into two regions: the 20th line through the 263rd line spanning 244 lines are used as a first-field active video portion ACV1, and the 283rd line through the 525th line spanning 243 lines are employed as a second-field active video portion ACV2.

The active video portions ACV1 and ACV2 are preceded respectively by vertical blanking portions VBK1 and VBK2 of nine lines each, as well as by optional blanking portions OBK1 and OBK2 of 10 lines each.

Below is a description of how the SDI transmission system 100 shown in FIG. 5 works.

On the transmitting side, the video data Vin and audio data Vin are fed to the SDI format encoder 110. Through its processing, the SDI format encoder 110 provides the 10-bit parallel digital data PDt in the SDI format. The parallel digital data PDt is sent to the transmission data encoder 120. In the transmission data encoder 120, the P/S converter 121 converts the parallel data PDt into the serial digital data SDt. The scrambler 122 scrambles the serial digital data SDt. Further, the NRZ/NRZI converter 123 converts the scrambled data from NRZ code to NRZI code, whereby the transmission data TSD is obtained. The cable driver 124 transmits the transmission data TSD onto the coaxial cable 150. The transmission data TSD is transmitted to the receiving side by way of the repeaters $160_{-1}$ through $160_{-n}$.

On the receiving side, the data sent from the coaxial cable 150 is supplied to the transmission data decoder 130. In the transmission data decoder 130, the cable equalizer 131 and the D-type flip-flop 133 perform a data regeneration process to obtain the reception data RSD. The NRZI/NRZ converter 134 receives the reception data RSD and converts it from NRZI code to NRZ code. The descrambler 135 descrambles the output data from the converter 134 to provide the serial digital data SDr. The S/P converter 136 receives the serial digital data SDr and converts it into the 10-bit parallel digital data PDr in the SDI format. The SDI format decoder 140 receives the parallel digital data PDr and processes the same so as to obtain the video data Vout and audio data Aout.

In each of the repeaters $160_{-1}$ through $160_{-n}$ as practiced and described above, the cable equalizer 161 and D-type flip-flop 163 perform the data regeneration process to obtain the reception data RSD. The reception data RSD is converted by the NRZI/NRZ converter 164 to NRZ code. The descrambler 165 descrambles the output data from the converter 164 to provide the serial digital data SDr. The scrambler 166 scrambles the serial digital data SDr and then the NRZ/NRZI converter 167 converts the scrambled data from NRZ code to NRZI code, whereby the retransmission data Dout is obtained.

When the data Din constitutes a pathological signal, the serial digital data SDr takes on a specific pattern that will likely generate the pathological signal. At this point, however, there is a very low possibility that the D-type flip-flops in the scrambler 166 and NRZ/NRZI converter 167 are in a particular state prone to generating the pathological signal. That is, even when the data Din constitutes a pathological signal, there is only a remote possibility of the retransmission data Dout becoming a pathological signal as well. More specifically, the probability of pathological signal appearance is given as $2^{-10}$ because the scrambler 166 and NRZ/NRZI converter 167 utilize the same total of 10 D-type flip-flops as the ones the scrambler 122 and NRZ/NRZI converter 123 utilize (see FIG. 6).

Thus the inventive signal processing circuit and method used in the repeaters $160_{-1}$ through $160_{-n}$ prevent propagation of a pathological signal therethrough and minimize the cumulative increase of jitters in a multi-stage repeating session, whereby a highly reliable serial transmission system is implemented.

Figure 10:
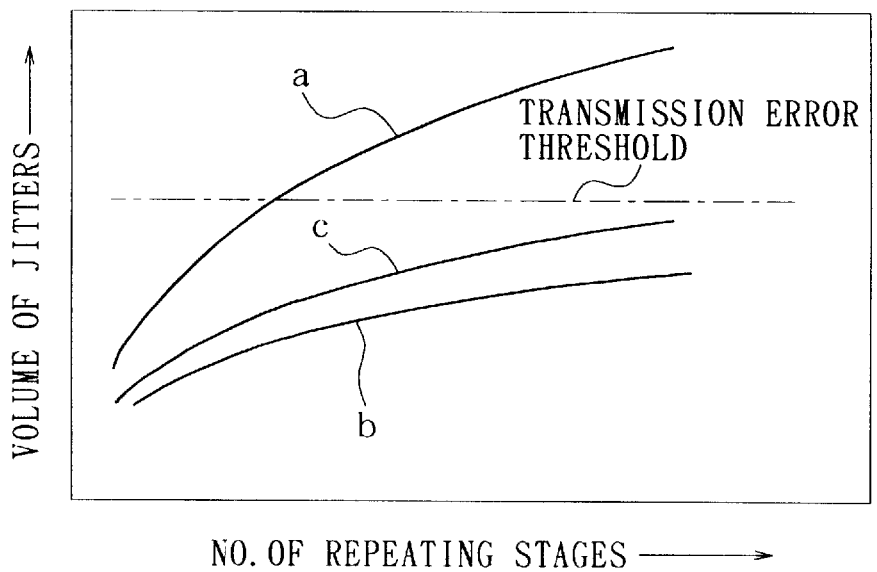
FIG. 10 is a conceptual view showing increases of jitters in multi-stage repeating sessions.

FIG. 10 is a conceptual view showing increases of jitters in the multi-stage repeating session. In FIG. 10, a curve "a" plots an increase of jitters in effect when the transmission data TSD becomes a pathological signal in the conventional SDI transmission system. A curve "b" indicates an increase of jitters applicable when the transmission data TSD is random data in the conventional SDI transmission system. A curve "c" represents an increase of jitters in effect when the transmission data TSD constitutes a pathological signal in a multi-stage repeating session of the SDI transmission system 100 as shown in FIG. 5.

Figure 4:
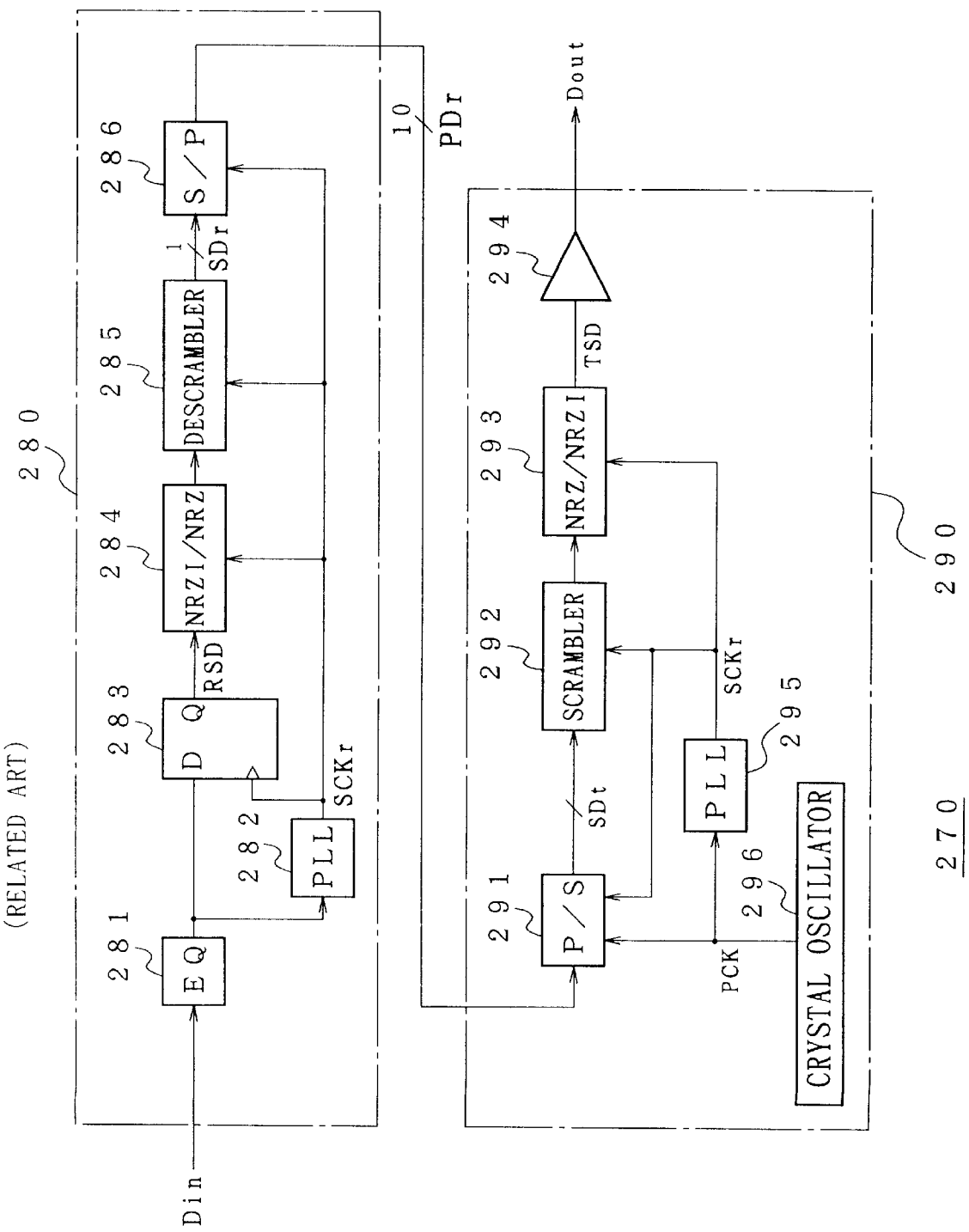
FIG. 4 is a block diagram depicting a structure of the conventional repeater.

In the repeaters $160_{-1}$ through $160_{-n}$, according to the invention, the retransmission data Dout is acquired by the scrambler 166 scrambling the serial digital data SDr from the descrambler 165 using the serial clock signal SCK regenerated by the PLL circuit 162 as shown in FIG. 8, not obtained by converting the received data back to parallel digital data and then scrambling the data using a new clock signal from a crystal oscillator 296 as the repeater 270 shown in FIG. 4. Thus, the inventive makeup reduces the scale of the circuits involved and helps lower fabrication costs.

Figure 11:
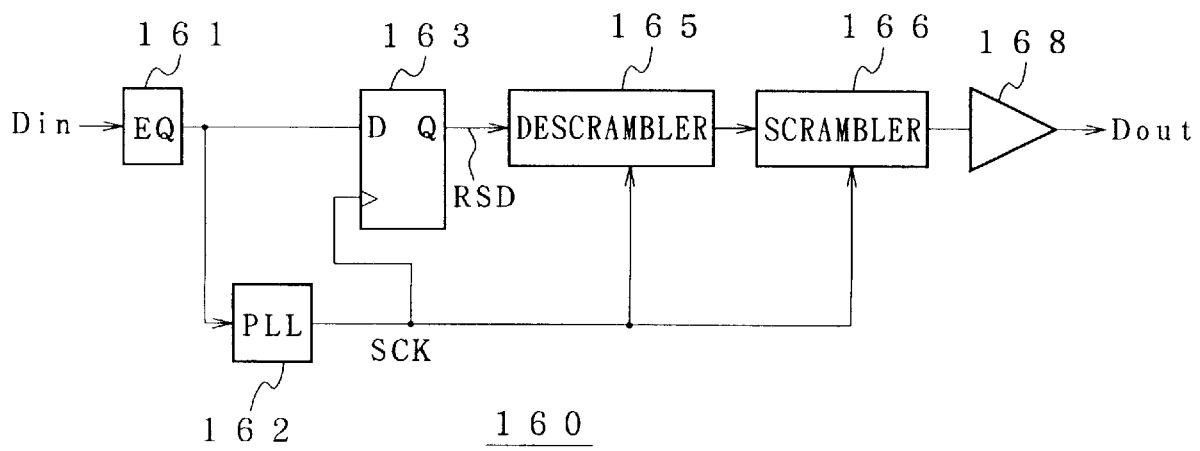
FIG. 11 is a block diagram depicting another structure of the repeater embodying the invention.

In the foregoing description, the repeater 160 (any one of $160_{-1}$ through $160_{-n}$) has been shown having the NRZI/NRZ converter 164 located upstream of the descrambler 165 and the NRZ/NRZI converter 167 furnished downstream of the scrambler 166. However, this is not limitative of the invention. Since NRZI/NRZ conversion and descrambling are mathematically interchangeable, the two components representing these functions may be switched between their positions. Such an arrangement makes it possible for the repeater 160 (any one of $160_{-1}$ through $160_{-n}$) to exclude from its constitution the NRZI/NRZ converter 164 and NRZ/NRZI converter 167 as shown in FIG. 11. The alternative arrangement also contributes to further reducing the circuit scale. The probability of pathological signal propagation in such a setup is sufficiently low, defined as $2^{-9}$ because the scrambler 166 includes nine D-type flip-flops.

In the description above, the invention has been shown as being applied to the transmission system 100 for transmitting data in the SDI format. Alternatively, the invention is also applied advantageously to any other data transmission system for transmitting data vulnerable to the propagation of a pathological signal, such as data in the HD (High Definition) SDI format (standardized under SMPTE-292M).

As described above and according to the invention, serial digital data is subjected to a scrambling process represented by a generating polynomial to acquire input serial digital data. The acquired data is descrambled and again made to undergo a scrambling process based on the above generating polynomial, whereby output serial digital data is obtained. When applied illustratively to repeaters of an SDI transmission system, the inventive signal processing circuit and method constitute an inexpensive and highly reliable serial transmission system on a limited circuit scale capable of preventing the propagation of a pathological signal and minimizing the cumulative increase of jitters in multi-stage repeating sessions.

As many apparently different embodiments of this invention may be made without departing from the spirit and scope thereof, it is to be understood that the invention is not limited to the specific embodiments thereof except as defined in the appended claims.

What is claimed is:

1. A signal processing circuit comprising:

first signal processing means for descrambling input serial digital data obtained by subjecting given serial digital data to a scrambling process represented by a generating polynomial; and second signal processing means for acquiring output serial digital data by subjecting the serial digital data received from said first signal processing means to a scrambling process represented by said generating polynomial.

2. A signal processing circuit according to claim 1, wherein said input serial digital data is obtained by subjecting said given serial digital data to said scrambling process represented by said generating polynomial and then converting the scrambled data from NRZ code to NRZI code.

3. A signal processing circuit according to claim 2, further comprising:

first signal converting means for converting said input serial digital data from NRZI code to NRZ code, said first converting means being located upstream of said first signal processing means; and second signal converting means for converting the serial digital data received from said second signal processing means from NRZ code to NRZI code and obtaining said output serial digital data thereby, said second signal converting means being located downstream of said second signal processing means.

4. A signal processing method comprising the steps of:

first signal processing step for descrambling input serial digital data obtained by subjecting given serial digital data to a scrambling process represented by a generating polynomial; and second signal processing step for acquiring output serial digital data by subjecting the serial digital data obtained by said first signal processing step to a scrambling process represented by said generating polynomial.

5. A signal processing method according to claim 4, wherein, said input serial digital data is obtained by subjecting said given serial digital data to said scrambling process represented by said generating polynomial, and then converting the scrambled data from NRZ code to NRZI code.

6. A signal processing method according to claim 5, further comprising the steps of:

third signal processing step for converting said input serial digital data from NRZI code to NRZ code before the first signal processing step; and forth signal processing step for converting serial digital data obtained by said second signal processing step from NRZ code to NRZI code and obtaining said output serial digital data thereby after the second signal processing step.

* * * * *